(12) United States Patent
Deng et al.

(10) Patent No.: US 11,961,773 B2
(45) Date of Patent: Apr. 16, 2024

(54) SEMICONDUCTOR ETCHING METHODS

(71) Applicant: Oxford Instruments Nanotechnology Tools Limited, Abingdon Oxon (GB)

(72) Inventors: Ligang Deng, Bristol (GB); Katie Hore, Bristol (GB)

( * ) Notice: Subject to any disclaimer, the term of this patent is extended or adjusted under 35 U.S.C. 154(b) by 554 days.

(21) Appl. No.: 17/261,782

(22) PCT Filed: Jul. 17, 2019

(86) PCT No.: PCT/GB2019/051997
§ 371 (c)(1),
(2) Date: Jan. 20, 2021

(87) PCT Pub. No.: WO2020/016578
PCT Pub. Date: Jan. 23, 2020

(65) Prior Publication Data
US 2021/0296187 A1    Sep. 23, 2021

(30) Foreign Application Priority Data
Jul. 20, 2018  (GB) .................................... 1811873

(51) Int. Cl.
*H01L 21/3065* (2006.01)
*H01J 37/32* (2006.01)
(Continued)

(52) U.S. Cl.
CPC ........ *H01L 22/26* (2013.01); *H01J 37/32082* (2013.01); *H01J 37/32449* (2013.01);
(Continued)

(58) Field of Classification Search
None
See application file for complete search history.

(56) References Cited

U.S. PATENT DOCUMENTS

| 5,034,092 A | 7/1991 | Lebby et al. |
| 5,293,392 A | 3/1994 | Shieh et al. |

(Continued)

FOREIGN PATENT DOCUMENTS

| EP | 0414372 A2 | 7/1990 |
| GB | 2026922 A | 2/1980 |

(Continued)

OTHER PUBLICATIONS

Youtsey, et al., "Dry and Wet Etching for Group III—Nitrides", Department of Electrical and Computer Engineering, University of Illinois, Urbana-Champaign, MRS Internet J. Nitride Semiconductor Res. 4S1, G1.4, 1999, 11 pages.

(Continued)

*Primary Examiner* — Shamim Ahmed
(74) *Attorney, Agent, or Firm* — Brooks, Cameron & Huebsch, PLLC

(57) ABSTRACT

A method of etching into a one or more epitaxial layers of respective semiconductor material(s) in a vertical cavity surface emitting laser (VCSEL) semiconductor structure, wherein the or each semiconductor material is a III-V semiconductor material, a III-N semiconductor material, or a II-VI semiconductor material is disclosed. The method comprises placing a substrate having the semiconductor structure thereon onto a support table in a plasma processing chamber, the semiconductor structure carrying a patterned mask on the surface of the semiconductor structure distal from the support table. The method also includes process steps of establishing a flow of an etch gas mixture through the plasma processing chamber and generating a plasma within the plasma processing chamber and simultaneously applying a radio frequency (RF) bias voltage to the support table; whereby the portion(s) of the semiconductor structure not covered by the patterned mask are exposed to the etch (Continued)

gas mixture plasma and are thereby etched to form at least one feature in the semiconductor structure; wherein more than 90% of the etch gas mixture consists of a mixture of silicon tetrachloride ($SiCl_4$) and nitrogen ($N_2$).

19 Claims, 7 Drawing Sheets

(51) Int. Cl.
*H01L 21/308* (2006.01)
*H01L 21/66* (2006.01)
*H01S 5/20* (2006.01)
*H01L 31/18* (2006.01)
*H01L 33/00* (2010.01)
*H01S 5/183* (2006.01)
*H01S 5/30* (2006.01)

(52) U.S. Cl.
CPC .... *H01J 37/32816* (2013.01); *H01L 21/3065* (2013.01); *H01L 21/308* (2013.01); *H01S 5/2086* (2013.01); *H01J 2237/334* (2013.01); *H01L 31/1828* (2013.01); *H01L 31/1856* (2013.01); *H01L 33/0075* (2013.01); *H01L 33/0083* (2013.01); *H01S 5/183* (2013.01); *H01S 5/3013* (2013.01)

(56) References Cited

U.S. PATENT DOCUMENTS

| | | | |
|---|---|---|---|
| 5,422,901 | A | 6/1995 | Lebby et al. |
| 5,468,656 | A | 11/1995 | Shieh et al. |
| 6,057,230 | A | 5/2000 | Liu |
| 6,577,658 | B1 | 6/2003 | Lee et al. |
| 2001/0025826 | A1 | 10/2001 | Pierson et al. |
| 2003/0138017 | A1 | 7/2003 | Lee et al. |
| 2010/0159706 | A1 | 6/2010 | Qiu et al. |
| 2011/0244686 | A1 | 10/2011 | Aso et al. |
| 2011/0263111 | A1* | 10/2011 | Melnik ............... C30B 29/403 257/E21.135 |
| 2017/0338122 | A1* | 11/2017 | Daulton ............ H01L 21/30621 |
| 2018/0025914 | A1* | 1/2018 | Zhou ................ H01L 21/32135 438/695 |
| 2018/0151435 | A1* | 5/2018 | Chiang ............... H01L 21/3065 |

FOREIGN PATENT DOCUMENTS

| | | |
|---|---|---|
| GB | 2407434 A | 4/2005 |
| JP | H02181921 A | 7/1990 |
| JP | H02260422 A | 10/1990 |
| JP | H0574929 A | 3/1993 |
| JP | H08293502 A | 11/1996 |
| JP | H09306877 A | 11/1997 |
| JP | 2005191343 | 7/2005 |
| JP | 6373526 B2 | 8/2018 |
| TW | 267268 | 1/1996 |
| TW | 201705267 | 2/2017 |
| WO | 2010073006 A1 | 7/2010 |
| WO | 2010100425 A2 | 9/2010 |
| WO | 2013128181 A1 | 9/2013 |

OTHER PUBLICATIONS

Combined Search and Examination Report from related Great Britain Application No. GB1910234.2, dated Nov. 26, 2019, 4 pages.
Examination Report from related Great Britain Application No. GB1910234.2, dated Dec. 4, 2020, 3 pages.
Golka, et al., "Low bias reactive ion etching of GaAs with a SiCl4/N2/O2 time-multiplexed process", J. Vac. Sci. Technol. B 25(3) May/Jun. 2007, 6 pages.
Golka, et al., "Processing of deeply etched GaAs/AlGaAs quantum cascade lasers with grating structures", Progress in Compound Semiconductor Materials IV—Electronic and Optoelectronic Applications Symposium, Material Research Society, 2005, 5 pages.
Howard, et al., "Reactive ion etching of copper in SiCl4-based plasmas", Materials Engineering Department and Center for Integrated Electronics, Rensselaer Polytechnic Institute, Troy, NY Appl. Phys. Lett. 59(8), Aug. 19, 1991, 4 pages.
International Preliminary Report on Patentability from related PCT Application No. PCT/GB2019/051997, dated Jan. 26, 2021, 8 pages.
International Search Report and Written Opinion from related PCT Application No. PCT/GB2019/051997, dated Oct. 11, 2019, 16 pages.
Lee, et al. "Advanced selective dry etching of GaAs/AlGaAs in high density inductively coupled plasmas", Journal of Vacuum Science and Technology, vol. 18, Jul. 2000, 6 pages.
Lee, et al., "Inductively coupled plasma etching of III-V semiconductors in Cl2-based chemistries", Materials Science in Semiconductor Processing, 1998, 9 pages.
Lee, et al., "Significant enhancement of selectivity and anisotropy for high rate plasma etching of GaAs over AlGaAs for heterojunction bipolar transistor structure", 10 pages.
Liu, et al. "Inductively coupled plasma etching of GaAs in Cl2/Ar, Cl2/Ar/O2chemistries with photoresist mask", Applied Surface Science, Aug. 24, 2015, 4 pages.
Oubensald, et al., "Effect of the addition of SF 6 and N2 in inductively coupled SiCl4 plasma for GaN etching", Semiconductor Science and Technology, Jun. 26, 2009, 9 pages.
Combined Search and Examination Report from related Great Britain Application No. GB1811873.7, dated Dec. 10, 2018, 8 pages.
Schul, et al., "High-density plasma etching of compound semiconductors", Journal of Vacuum Science and Technology, Jun. 4, 1998, 6 pages.
Stern, et al., "Reactive ion etching of GaAs and InP using SiCl4", Journal of Vacuum Science and Technology B: Microelectronics Processing and Phenomena, Sep. 13, 1983, 4 pages.
Zhang, et al., "Electron cyclotron resonance etching characteristics of GaN in SiCl4/Ar", Center for High Technology Materials, Nov. 7, 1995, 4 pages.
Lee, et al., "Room-temperature Inductively counpled plasma etching of InP using Cl2/N2 and Cl2/CH4/H2", Chinese Physics Letter vol. 23, Chinese Physics Society and IOP 2006, 4 pages.
Examination Report from related Taiwan Patent Application No. 108125446, dated Jun. 5, 2023, 22 pages.

\* cited by examiner

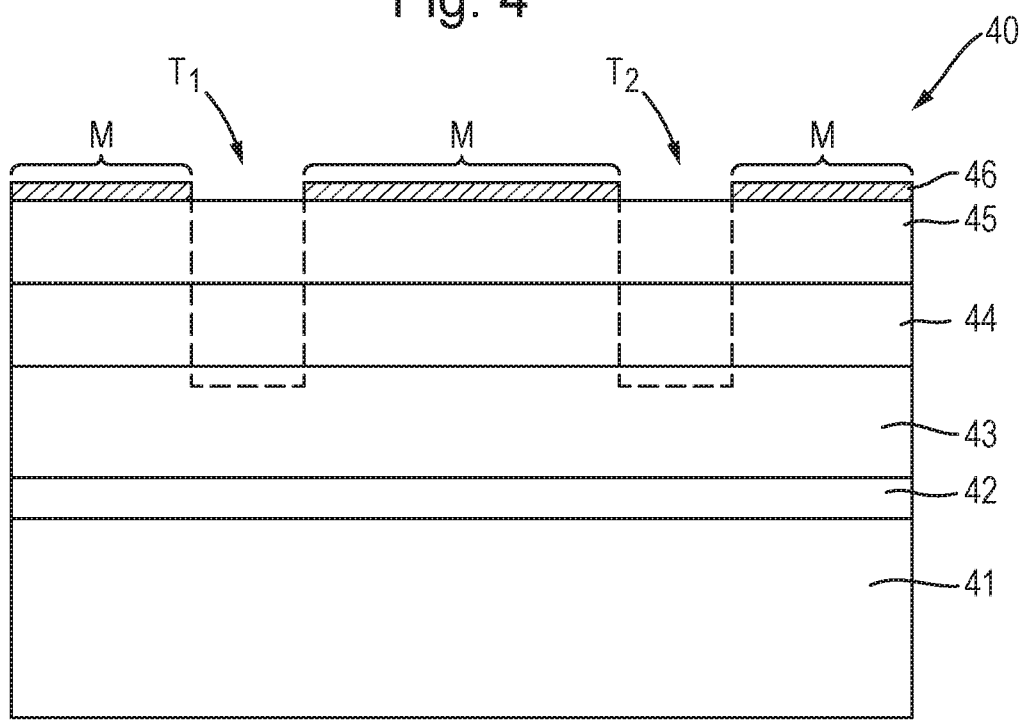
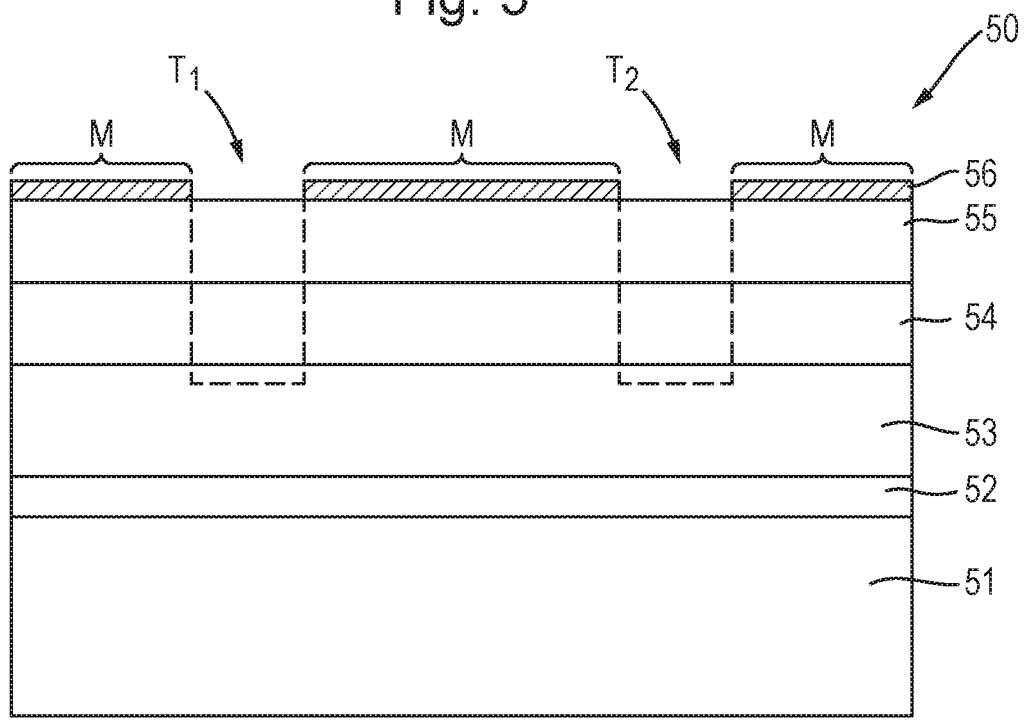

SEMICONDUCTOR ETCHING METHODS

The present invention relates to methods for etching vertical cavity surface emitting laser (VSCEL), light emitting diode (LED) and photodiode semiconductor structures, particularly plasma etching methods. Each of these semiconductor structures is an example of an optoelectronic device. The disclosed methods are particularly well suited for etching trenches into multiple epitaxial layers of different materials in semiconductor structures forming optoelectronic devices of the kinds recited above Many semiconductor devices comprise a stack of different semiconductor materials, typically III-V and/or II-VI materials, deposited on a substrate using known techniques. For example, a VCSEL structure may consist of a III-V heterojunction semiconductor structure with light-confining mirrors grown in the same epitaxial stack. To define the device, a mesa shape is formed by etching one or more trenches into the stack around what is to be used as the active area. Various methods for etching are known and an example is disclosed in U.S. Pat. No. 5,034,092, which describes a reactive ion etch system utilising an etch gas mixture of primarily silicon tetrachloride ($SiCl_4$) and boron trichloride ($BCl_3$) to etch a masked VCSEL structure. This etch gas mixture is said to achieve a slow controllable etch rate and a more anisotropic (directional) etch believed to be caused by side-wall protection (passivation) due to deposition of silicon and/or boron compounds on the side walls of the trench. Another exemplary etch method is disclosed in "Advanced selective dry etching of GaAs/AlGaAs in high density inductively coupled plasmas", by J W Lee et al, J. Vac. Sci. Technol. A 18(4), July/August 2000, pp 1220-1224. In this case, an etch gas mixture comprising boron trichloride ($BCl_3$), sulphur hexafluoride ($SF_6$), nitrogen ($N_2$) and helium (He) is used to etch GaAs (selectively over AlGaAs) using a patterned photoresist mask. The addition of nitrogen and helium was found to significantly improve surface morphology though also decreasing the etch rate. The authors postulate that the presence of nitrogen increased side wall passivation (and hence anisotropy of the etch) by reacting with the photoresist mask to product organic polymer compounds which deposited onto the sidewalls and elsewhere.

Improved etch techniques are constantly being sought.

A first aspect of the invention provides a method of etching into one or more epitaxial layers of respective semiconductor material(s) in a VCSEL semiconductor structure, wherein the or each semiconductor material is a III-V semiconductor material, a III-N semiconductor material, or a II-VI semiconductor material, the method comprising:

placing a substrate having the semiconductor structure thereon onto a support table in a plasma processing chamber, the semiconductor structure carrying a patterned mask on the surface of the semiconductor structure distal from the support table; and process steps of:

establishing a flow of an etch gas mixture through the plasma processing chamber; and generating a plasma within the plasma processing chamber and simultaneously applying a radio frequency (RF) bias voltage to the support table;

whereby the portion(s) of the semiconductor structure not covered by the patterned mask are exposed to the etch gas mixture plasma and are thereby etched to form at least one feature in the semiconductor structure;

wherein more than 90% of the etch gas mixture consists of a mixture of silicon tetrachloride ($SiCl_4$) and nitrogen ($N_2$).

A second aspect of the invention provides a method of etching into one or more epitaxial layers of respective semiconductor material(s) in an LED semiconductor structure, wherein the or each semiconductor material is a III-V semiconductor material, a III-N semiconductor material, or a II-VI semiconductor material, the method comprising:

placing a substrate having the semiconductor structure thereon onto a support table in a plasma processing chamber, the semiconductor structure carrying a patterned mask on the surface of the semiconductor structure distal from the support table; and process steps of:

establishing a flow of an etch gas mixture through the plasma processing chamber; and generating a plasma within the plasma processing chamber and simultaneously applying a radio frequency (RF) bias voltage to the support table;

whereby the portion(s) of the semiconductor structure not covered by the patterned mask are exposed to the etch gas mixture plasma and are thereby etched to form at least one feature in the semiconductor structure;

wherein more than 90% of the etch gas mixture consists of a mixture of silicon tetrachloride ($SiCl_4$) and nitrogen ($N_2$).

A third aspect of the invention provides a method of etching into one or more epitaxial layers of respective semiconductor material(s) in a photodiode semiconductor structure, wherein the or each semiconductor material is a III-V semiconductor material, a III-N semiconductor material, or a II-VI semiconductor material, the method comprising:

placing a substrate having the semiconductor structure thereon onto a support table in a plasma processing chamber, the semiconductor structure carrying a patterned mask on the surface of the semiconductor structure distal from the support table; and process steps of:

establishing a flow of an etch gas mixture through the plasma processing chamber; and generating a plasma within the plasma processing chamber and simultaneously applying a radio frequency (RF) bias voltage to the support table;

whereby the portion(s) of the semiconductor structure not covered by the patterned mask are exposed to the etch gas mixture plasma and are thereby etched to form at least one feature in the semiconductor structure;

wherein more than 90% of the etch gas mixture consists of a mixture of silicon tetrachloride ($SiCl_4$) and nitrogen ($N_2$).

The present inventors have found that the use of this novel etch gas mixture, formed predominantly of silicon tetrachloride ($SiCl_4$) and nitrogen ($N_2$), produces unexpectedly good etch results. This is not only in terms of etch anisotropy, but also in achieving a flatter base of the etched feature (which may be a trench or a hole, for example). In particular, conventional etching process result in an area of reduced etch depth immediately adjacent the wall of the trench (or other feature), which region is known as the "footing". The "footing" lies between the wall and the "floor", which is the deepest part of the etched feature and tends to be substantially flat. It is highly beneficial to the operation of the semiconductor device which the structure is to form if the whole etch base (i.e. the footing and the floor) terminates within a single epitaxial layer across as much as possible of the etched area. For example, not only is the device yield increased, but in the case of a VCSEL, the resulting laser line width is reduced if the footing is as level as possible. Whereas, in conventional etch techniques, most attention has been paid to the etched profile of the mesa, including the shape of the bottom corner of the trench, the present inventors have realised that profile control should extend across the etch floor, and have developed the above method for achieving this. Low "footings", such as those having a maximum height of less than 200 nm above the etch floor (thereby ideally keeping the base within one epitaxial layer of the structure), or less than 4% of the total etch depth (whichever is smaller)—and, even, less than 2% or 3%—have been achieved through the presently disclosed technique.

In general terms, plasma etching works by creating new volatile species from the input gas(es) and the semiconductor material to be etched, assisted by ion bombardment. Etching a compound semiconductor of two, three, or more solid elemental components is more difficult than etching a single material such as silicon, because several different volatile compounds must be formed. Where an anisotropic etch is required, the formation of volatile species from neutral gas species upon contact with the semiconductor surface (without requiring ion bombardment) needs to be avoided and/or countered by a deposition process which protects vertical surfaces created by etching—a method called 'sidewall passivation'. This enables the trench to grow downwards, between steep sidewalls.

The sidewalls, however, have a direct effect on the profile of the floor of the base of the trench and tend to cause the presence of a "footing", as described above. For instance, ions can reflect from the developing sidewall and increase the etching at the floor of the feature, distant from the sidewall, a process known as 'trenching'. The region adjacent to a vertical wall can have a lower etch rate, due to the shadowing effect of the wall to inbound gas species, or the quenching of active radicals on the exposed sidewall. Excessive sidewall passivation can also lead to a rough etch floor, due to the deposition of material. All of these factors can lead to a "footing" with a significant height.

The use of a $SiCl_4/N_2$ etch gas mixture (as defined above) has been found by the inventors to reduce the height of the footing, and thereby improve the flatness of the base of the etched feature overall. Without wishing to be bound to theory, it is believed that by providing nitrogen as a significant proportion of the etch gas mixture, in combination with $SiCl_4$, it has a direct passivation effect on the etch sidewall, where it counters the additional ion flux which may cause trenching, but to a lesser degree than that typically achieved by conventional methods which over-passivate the etch floor. Alternatively the passivated etch sidewall achieved with $SiCl_4$ and $N_2$ does not quench radicals as much as conventional etch methods, providing a more constant flux of radicals across the etch floor. By a "direct" passivation effect, we mean, unlike in the technique disclosed by Lee et al, the nitrogen achieves passivation without requiring the presence of a photoresist mask (for instance, the presently disclosed technique has been shown to work using an inorganic mask, such as silicon nitride—this has the additional benefit that no additional organic polymers are formed and deposited on the structure, which can require extra cleaning).

Additionally, the present inventors have found that high etch rates can be achieved using the disclosed etch gas mixture, which is beneficial to throughput. For example, an etch rate of at least 500 nm/min has been achieved through GaAs using the presently disclosed technique, which compares favourably with those of conventional techniques (e.g. Lee et al achieve a maximum etch rate of around 300 nm/min). High selectivity to a silicon nitride mask (e.g. over 4:1 selectivity ratio) and high angle sidewalls (e.g. 60 to 80 degrees angle between the wall and a line parallel to the etch floor) have also been demonstrated.

The etch gas mixture is predominately (over 90%) $SiCl_4$ and $N_2$ but can contain minor amounts of other gases as mentioned below. Nonetheless, it is preferred that the proportion of the total gas mixture contributed by $SiCl_4$ and $N_2$ is high and so in preferred embodiments, at least 95% of the etch gas mixture consists of silicon tetrachloride ($SiCl_4$) and nitrogen ($N_2$), and in some preferred cases substantially 100% of the etch gas mixture will consist of these two components. Trace levels (which have a negligible effect on the result) of other gases may or may not still be present, e.g. at less than 1% of the etch gas mixture.

Where the etch gas mixture does comprise one or more additional gases, these may be for purposes such as promoting ion bombardment, diluting the etch gas, adjusting the chemical reactions taking place or improving heat transfer (in which latter case the additional gas is injected below the wafer). In preferred examples, the etch gas mixture further comprises one or more inert gases, such as helium, preferably forming less than 5% of the etch gas mixture.

Preferably, silicon tetrachloride ($SiCl_4$) is the only halogen-bearing gas in the etch gas mixture present at more than trace levels. Trace levels of gases have already been defined above as less than 1% of the etch gas mixture. It is advantageous to perform an etch process with the minimum number of different gases in a mixture, both to assist optimisation and to reduce problems due to gas ratio variations in use. In particular, it is preferred that the etch gas mixture does not contain more than a trace level of boron trichloride ($BCl_3$), preferably no boron trichloride. The present inventors have found that the presence of boron trichloride can result in decreased flatness of the etch footing.

Establishing the flow of the etch gas mixture through the plasma processing chamber could comprise introducing each of the components of the etch gas mixture into the plasma processing chamber separately such that the etch gas mixture is formed inside the plasma processing chamber. However, preferably the etch gas mixture is pre-mixed and supplied complete to the chamber.

As noted above, the present inventors have found that nitrogen should be present in a significant quantity in the etch gas mixture to best improve the flatness of the footing. The particular proportion of the two gases (relative to one another) which achieves the flattest footing depends on the semiconductor material(s) being etched, but it has been found preferable for the ratio of silicon tetrachloride to nitrogen ($SiCl_4:N_2$) in the etch gas mixture to be in the range of about 1:3 to 3:1 (i.e. 25% $SiCl_4$/75% $N_2$ to 75% $SiCl_4$/ 25% $N_2$), more preferably in the range of about 1:2 to 4:3 (i.e. 33% $SiCl_4$/67% $N_2$ to 57% $SiCl_4$/43% $N_2$), and most preferably about 1:2 (i.e. 33% $SiCl_4$/67% $N_2$). Most preferably, the amount of nitrogen contained in the etch gas mixture is equal to or more than the amount of $SiCl_4$ contained in the etch gas mixture. Nitrogen rich etch gas mixtures such as these have been found to achieve the lowest footing profile.

The semiconductor structure being etched comprise a plurality of epitaxial layers of respective semiconductor material(s), at least some of the respective semiconductor materials being different from one another (that is, the semiconductor structure is a heterostructure). In the etching method, at least one of the layers is etched into, preferably a plurality of the layers, most preferably all of the layers of the VCSEL, LED or photodiode semiconductor structure. The or each semiconductor material being etched is a III-V semiconductor material, a III-N semiconductor material, or a II-VI semiconductor material. The method has been found to work particularly well with such materials. The or each semiconductor material could a binary, ternary or quaternary semiconductor material. In particular preferred examples, the or each semiconductor material is any of: GaN, GaAs, AlGaAs, InGaAs or AlInGaP. (In the case of binary, ternary and quaternary compounds, it will be appreciated that each could contain any relative proportions of the elements).

As mentioned at the outset, the methods find application in the production of VCSEL, LED and photodiode semiconductor devices. Examples of such devices will be given below.

The plasma could be generated by any appropriate means and in preferred examples, it is generated using an induction coupled plasma source, a capacitive coupled plasma source, or a microwave plasma source. In advantageous implementations, the plasma is generated with a plasma power in the range 200 to 1500 W. The inventors have found that increasing the plasma power tends to increase the etch rate without reducing the flatness of the footing.

The RF bias voltage applied to the support table could be for example a continuous bias, a pulsed bias or a modulated bias. Preferably, the bias voltage applied to the support table has a bias power density in the range 0.5-2 W per square centimetre.

In preferred implementations, the etch gas mixture has a total gas flow rate in the range 5 sccm to 200 sccm, preferably 80 to 120 sccm, more preferably around 100 sccm. These preferred values are for a 150 mm diameter substrate. Higher flow rates are required for larger area substrates.

Preferably, the method further comprises controlling the pressure within the plasma processing chamber to a value in the range 0.5 to 10 mTorr. The inventors have found that increasing the pressure tends to increase the etch rate without reducing the flatness of the footing.

Preferably, the method further comprises controlling the temperature of the support table to a value in the range −10 to +50 degrees Celsius.

As noted at the outset, the disclosed technique enables better control of the footing profile and so, in particularly preferred implementations, the process steps (including, for example, the choice of etch gas mixture ratio and optionally the plasma power, bias power, pressure and/or temperature) are controlled such that the base of the etched feature(s) has a depth which varies across the width of the feature by no more than 200 nm, preferably by no more than 4% (more preferably 2%) of the average feature depth. It will be appreciated that here the "base" includes both the footing and the floor of the feature. Typically this will enable the variation in the level of the base (caused typically by the presence of the footing) to remain within a single layer of the semiconductor structure.

Preferably, the process steps are controlled such that the rate of etching is at least 500 nm/min.

Advantageously, the process steps are controlled such that the or each etched trench has a wall angle between 60 and 80 degrees, preferably between 65 and 75 degrees.

Preferably, the process steps are controlled such that the semiconductor to mask etch selectivity is at least 4:1, the patterned mask preferably comprising silicon nitride.

Each of the above results can be achieved through testing by varying the process parameters within the preferred ranges for each identified above, examining the etched feature, and adjusting one or more of the process parameters if the desired outcome has not been reached.

The end of the etching process can be determined in a number of ways. In one preferred implementation, the method further comprises halting the etching after a predetermined period of time has elapsed. This straightforward approach may be appropriate where the etch rate for the particular structure in question has been well established. In other preferred embodiments, the method further comprises monitoring the progress of the etching and preferably halting the etching when a predetermined depth has been reached and/or when a predetermined layer in the semiconductor structure has been reached. For example, the progress of the etching may be monitored using an optical interferometer or optical emission spectroscopy. This may achieve a more accurate result, especially in the case of structures of a type which have not previously been etched under the same conditions.

The above-described etching method could be a complete, standalone process applied to the semiconductor structure. However, in other cases the said method may be a sub-part of another process, in which case the disclosed method may be performed as one of a sequence of processing steps, the other processing steps each comprising any of a deposition step, a passivation step, a heat-treatment step and another etching step. Preferably, the sequence of processing steps is cyclical, and/or may define an atomic layer etching process or a reactive ion etching process. For instance, the overall process could be a Bosch type etching process, comprising alternate steps of etching (as described herein) and passivation (not described herein). An example of a Bosch type etching process is described in WO2013/128181.

Examples of etching methods and apparatus therefor in accordance with the present invention, will now be described and contrasted with conventional techniques with reference to the accompanying drawings, in which: —

FIG. 1 schematically depicts an exemplary surface processing tool adapted to carry out the presently disclosed methods;

FIG. 4 is a schematic cross-section through an exemplary LED semiconductor structure which may be etched in embodiments of the second aspect of the invention;

FIG. 5 is a schematic cross-section through an exemplary photodiode semiconductor structure which may be etched in embodiments of the third aspect of the invention;

Figure 1:
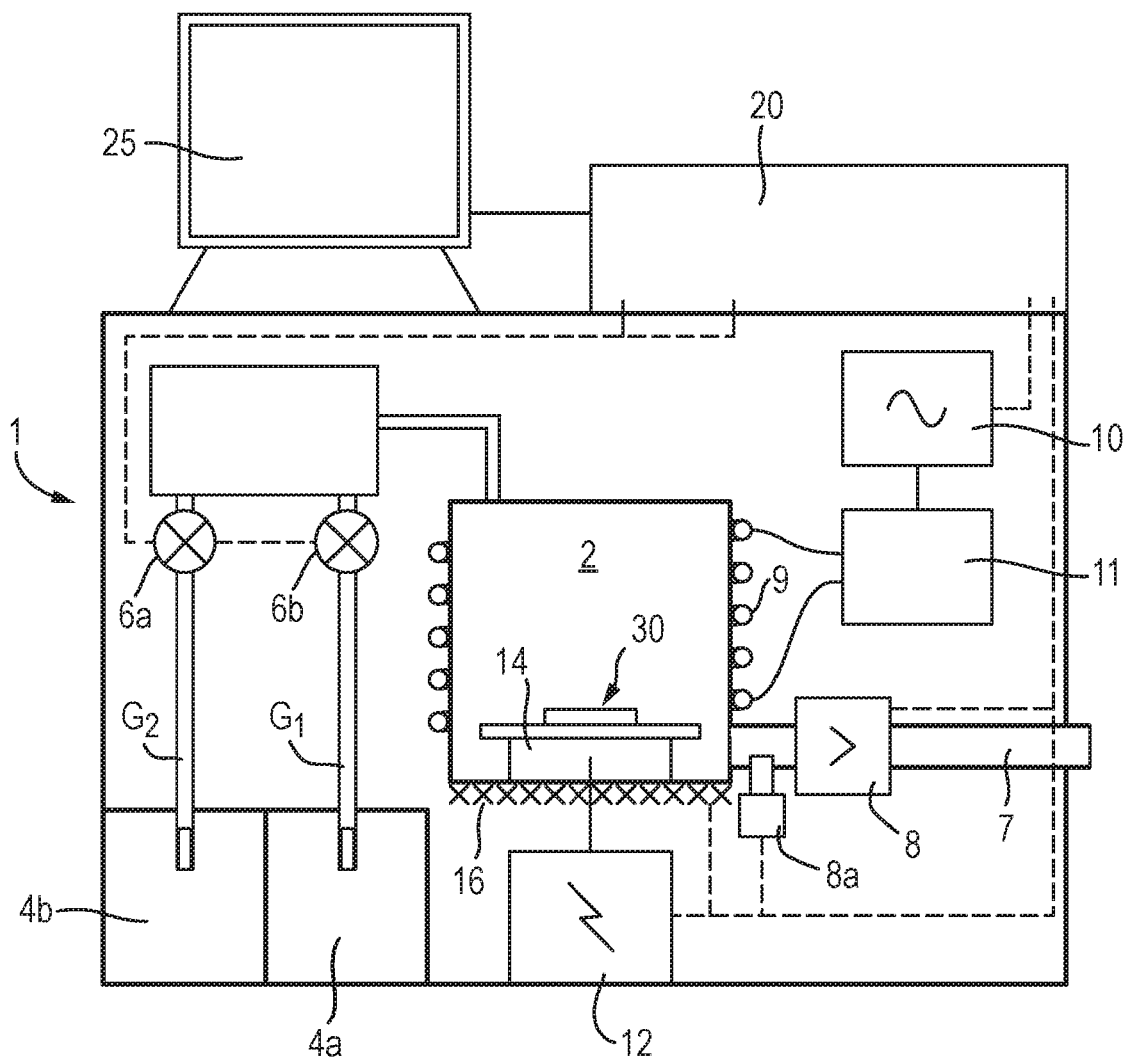

FIG. 1 shows an example of a plasma processing tool suitable for implementing the presently disclosed semiconductor etching methods. The plasma processing tool 1 comprises a process chamber 2 within which a substrate 30 is placed during use. To perform etching, two or more input gases are introduced to the process chamber 2 and the conditions controlled in order to effect the desired etching mechanism. The term "input gases" includes precursor gases as well as inert, carrier gases if required. The process parameters within the chamber are controlled and can be adjusted by a set of at least one (but more typically a plurality of) devices, of which examples are shown schematically in FIG. 1. In this example, the tool 1 is equipped with two input gas supplies 4(a) and 4(b) for supplying first and second input gases, $G_1$ and $G_2$ respectively, to the process chamber 2. For instance the first input gas $G_1$ may be silicon tetrachloride ($SiCl_4$) and the second input gas $G_2$ may be nitrogen ($N_2$). The ingress of each gas to the chamber 2 is controlled by valves 6(a) and 6(b) and respective mass flow controllers (not shown). The exhaust gas, including unreacted input gases and any reaction products, is removed from process chamber 2 via a duct 7 and associated pump(s) 8, the pump(s) 8 typically being capable of reducing the pressure within the chamber to near-vacuum conditions. The chamber pressure will be determined in the main part by the exhaust pump system and particularly the pumping speed and the "conductance" of the pumping line from the chamber to the pump (this is a factor related to the geometry of the pumping line). However during processing, when a plasma is created and/or when etching or deposition takes place, gaseous species may be lost or created inside the chamber thereby having an effect on the pressure. In order to regulate for such variation, an automatic pressure control valve 8a is preferably provided as known in the art. The valve 8a changes the conductance of the pumping line to thereby enable the chamber pressure to be maintained substantially constant at the desired level as the plasma is struck and the material etched.

The plasma processing tool 1 is equipped with a plasma source for generating a plasma within the process chamber by means of an electrical discharge. Here, the plasma source is depicted as an inductively-coupled plasma source comprising a coil 9 surrounding chamber 2, which is supplied with RF power from power supply 10 via a RF matching unit 11. The RF matching unit 11 is configured to match the plasma impedance to that of the RF supply 10 in order to maximise efficiency of power transfer from the supply to the plasma. An example of a suitable matching unit is disclosed in WO-A-2010/073006. Other types of plasma source such as a capacitively-coupled plasma (CCP) or a microwave plasma source could be used instead.

The substrate 30 is mounted in use on a platen 14. As described below, a bias voltage is applied in use to the substrate 30 and this is achieved by connecting a voltage source 12 to the platen 14. If an RF power supply 12 is used then an Automatic impedance Matching Unit (AMU) may preferably be provided to ensure good coupling of power from the power supply 12 to the wafer table 14. The tool 1 may further comprise a temperature control unit 16 such as a heater and/or cooling system for adjusting the processing temperature of the substrate (additional devices for heating and/or cooling of the process chamber and plasma source may be provided to assist with process control and/or to maintain hardware stability). For instance, where etching is primarily to be carried out, the substrate is preferably cooled using a circulating coolant to prevent the significant amount of energy transferred to the substrate during ion bombardment and/or during exothermic chemical reactions causing an undesirable increase in the substrate temperature.

The devices operate upon instruction from a controller 20, such as a programmable logic controller (PLC) or similar. In some cases, more than one controller can be provided, with each controller controlling one or a subset of the devices. The controller is also connected to a user interface device such as a computer workstation 25 for receiving input from the user and/or returning outputs.

In FIG. 1, the data connections between the various devices and the controller 20 are indicated by dashed lines. In practice, this may be implemented as a network such as a CANbus bridge, which has connections to each of the devices as well as the user interface 25. The bus typically comprises multiple network channels including one or more data channels such as serial data channels (e.g. RS485) and, optionally, one or more power channels. The controller 20 issues commands across the bus, each of which is addressed to one or more of the devices and includes instructions as to one or more process parameters the device in question is to implement. An example of a network protocol which could be used for the issuing of commands for the control of the devices is given in WO-A-2010/100425. Of course, many other network implementations are possible as will be appreciated by the skilled person.

Figure 2:
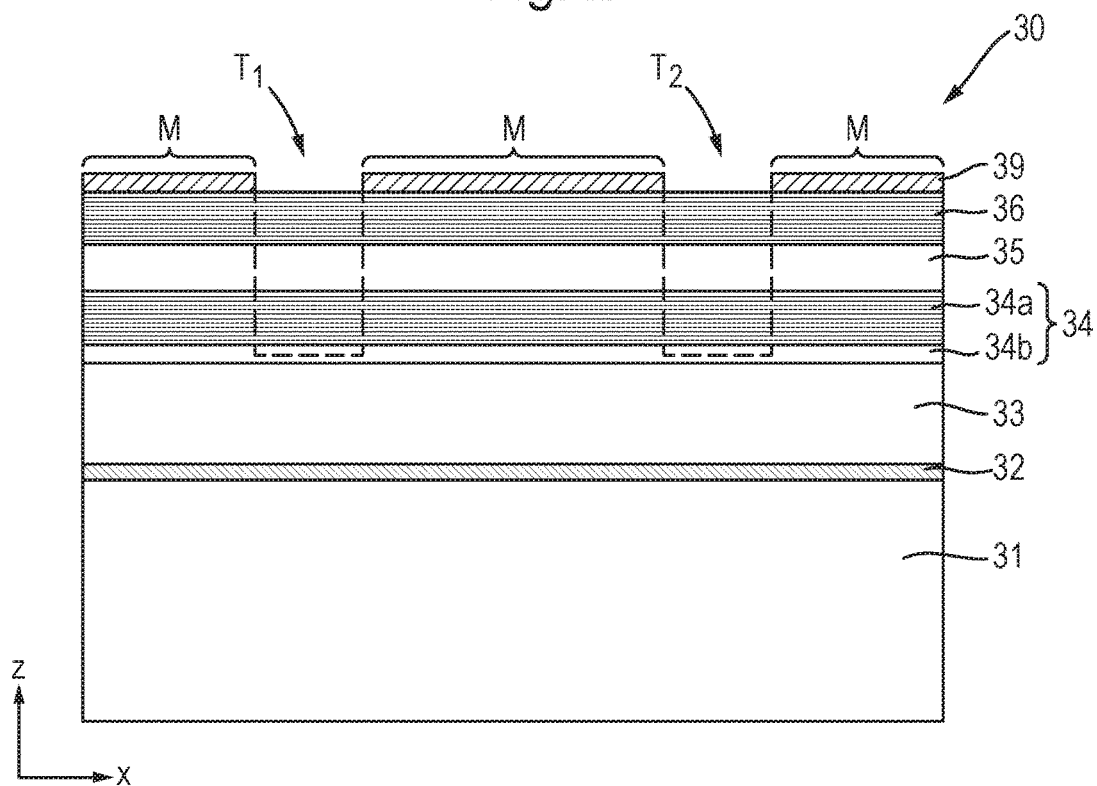
FIG. 2 is a schematic cross-section through an exemplary VCSEL semiconductor structure which may be etched in embodiments of the first aspect of the invention.

An example of a semiconductor structure 30 to be etched is shown in schematic cross-section in FIG. 2. In this example, the semiconductor structure 30 is representative of a vertical cavity surface emitting laser (VCSEL), but in other examples the semiconductor structure could be a light emitting diode (LED) device or a photodiode. Suitable structures for such devices are well-known. In general, each semiconductor layer to be etched typically comprises a III-V or a II-VI semiconductor material. For instance, the method is particularly well suited for use with III-N semiconductor materials. The or each semiconductor layer could be a binary semiconductor material such as GaN or GaAs, or ternary and quaternary mixtures of semiconductor materials such as AlGaAs, InGaAs or AlInGaP.

In the present example, the VCSEL semiconductor structure 30 is based on a support substrate 31 such as silicon, sapphire or the like followed by a metal contact layer 32. Alternatively the support substrate 31 can be a compound semiconductor wafer and the metal contact layer 32 is omitted. Next there is a substrate 33 such as n-GaAs, followed by a first reflector 34 such as a distributed Bragg reflector which in practice is formed of a plurality of sub-layers with alternating refractive index. For example, the sub-layers may be alternating layers of n-AlGaAs and n-GaAs. In FIG. 2, the majority of the sub-layers forming the reflector 34 are collectively labelled 34a whilst the final layer of the reflector 34 is labelled 34b and exaggerated in thickness purely for clarity. Above the first reflector 34 is an active region 35 consisting of one or more quantum wells for generating laser light, which also may comprise a plurality of constituent layers including confinement layers, the quantum well(s) themselves and quantum well barriers. These layers may be formed for example of AlGaAs, InGaAs and GaAs respectively. Above the active region 35 is a second reflector layer 36 which is of a similar construction to first reflection layer 34. On top of the semiconductor structure is a patterned mask 39, formed of silicon nitride, photoresist or the like. The mask 39 is present in accordance with a pattern of masked areas M spaced by one or more gaps in which features such as trenches $T_1$ and $T_2$ will be etched. After etching, the remaining mask material 39 will be removed and a metal contact applied to complete the device structure.

Figure 3:
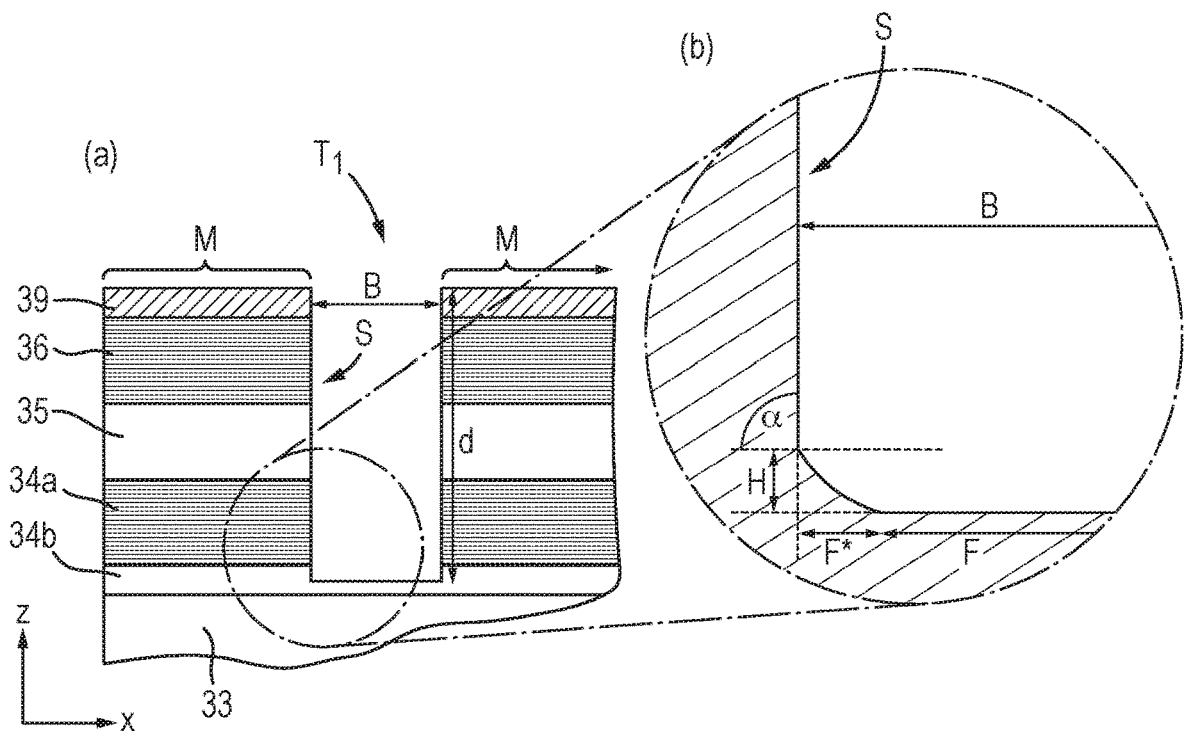
FIG. 3(a) shows an enlarged portion of the exemplary VCSEL semiconductor structure of FIG. 2 after etching.
FIG. 3(b) shows an enlarged detail thereof.

Detailed examples of the etch process itself will be provided below, but first FIG. 3(a) shows for reference a schematic cross-sectional view of a completed trench $T_1$ in the semiconductor structure 30 already described with reference to FIG. 2. Thus the completed trench $T_1$ has a maximum depth d, and its sidewalls S make a wall angle $\alpha$ with the horizontal (i.e. a line parallel to the floor of the trench). In the enlargement of FIG. 3(b), it will be seen that in practice the base B of the trench comprises a footing F* and a floor F, the footing F* being immediately adjacent the sidewall S and between the sidewall S and the floor F. The height of the footing F* above the floor F is denoted by arrow H. As described below, in preferred embodiments of the present invention, this height H is desirably no greater than 200 nanometres and is preferably no more than 4% (even more preferably 2%) of the average trench depth, d.

FIG. 4 shows a schematic cross-sectional view of an exemplary LED semiconductor structure 40. The semiconductor structure 40 includes a support substrate 41 on which there is formed a contact layer 42, which can serve as an electrical contact in the completed device. A substrate layer 43, which could be for example n-GaAs, is formed on the contact layer 42 and above the substrate 43 is a layer of n-type semiconductor material 44 (for example GaAs). A layer of p-type semiconductor material 45 (for example GaAsP) is formed on the n-type layer 44. In this embodiment the semiconductor materials forming the n-type layer 44 and the p-type layer 45 can be chosen so as to enable the semiconductor structure 40 to function as an LED device. A patterned mask 46 is provided on the p-type layer 45 and defines a pattern of masked areas M and trenches $T_1$, $T_2$, which will be etched into the semiconductor structure 40. The mask 46 is removed after etching and an additional metal contact can be provided above the p-type layer 45 to complete the LED device.

FIG. 5 shows a schematic cross-sectional view of an exemplary photodiode semiconductor structure 50. The semiconductor structure 50 includes a support substrate 51 (similar to the semiconductor structures 30, 40 described above with reference to FIGS. 3a, 3b and 4) and a contact layer 52 is formed on it. A layer of n-type semiconductor material 53 (for example n-type InP) is formed above the contact layer 52, and above the n-type layer 53 is a layer of intrinsic (i.e. not doped) semiconductor material 54, for example InGaAs. A layer of p-type semiconductor material 55 (for example p-type InP) is arranged on the intrinsic semiconductor layer 54. A patterned mask 56 is provided on the p-type layer 55. The mask 56 defines a pattern of masked areas M and trenches $T_1$, $T_2$ to be etched into the semiconductor structure 50. The mask 56 can be removed after the trenches $T_1$, $T_2$ have been etched and an additional metal contact could be provided above the p-type layer 55 to complete the photodiode device. Other features could also be incorporated into the finished device after the etching. For example, an anti-reflective coating could be formed above the p-type layer 55 to improve the transmission of light into the device.

To perform the etch, the masked semiconductor structure 30 (such as that shown in FIG. 2) is exposed to a flow of an etch gas mixture established in the plasma processing chamber 2. At the same time, a plasma is generated by the plasma source and a bias voltage is applied to the support table 14, which could be a continuous (DC) bias or a modulated, e.g. RF, bias. Exemplary values for each parameter will be given below.

Typically, an etch gas mixture will contain one or more of the following components and the composition overall is optimised by experiment:
1. One or more gases which provide the feedstock for the targeted volatile reaction products, often a halogen-bearing gas or a methyl-forming mixture.
2. Optionally an inert gas, normally a noble gas with substantial mass to promote the effects of ion bombardment in disrupting bonds in the solid material. Argon is the usual gas for this purpose.
3. Optionally, a diluent gas with minimal impact on the process chemistry. This is usually a noble gas, and helium is often chosen for its lack of chemical interaction together with its low mass to avoid sputtering.
4. Optionally, a gas to steer the chemistry. Hydrogen or oxygen are the usual choices, being chemically active in the plasma. Additions up to 20% are known to optimise the production of certain radicals, or to promote or suppress the formation of polymers where these can be formed.
5. Optionally, a gas to promote sidewall passivation and prevent undercut. Boron trichloride and silicon tetrachloride are both potential candidates here and have been used in mixtures with each other, or with chlorine, for etching compound semiconductor materials.

To illustrate the benefits of the etch gas mixtures proposed for use in embodiments of the present invention, first, results obtained using etch gas mixtures according to comparative examples will be described for contrast.

Figure 6:
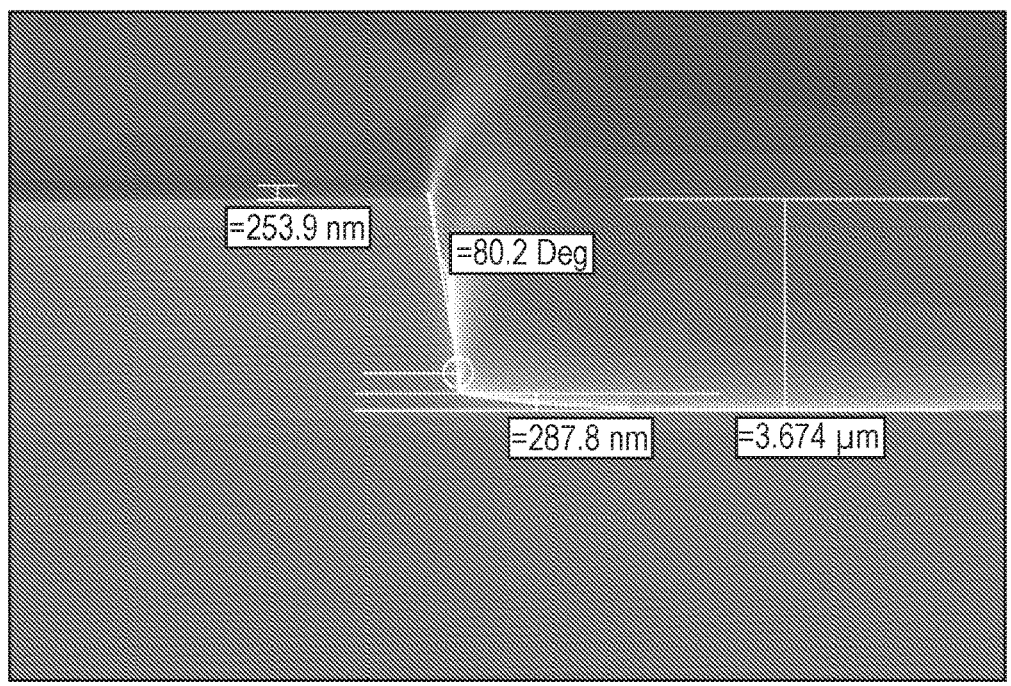
FIGS. 6 and 7 are SEM images of sections cut through exemplary semiconductor structures, etched using methods according to comparative examples.

FIG. 6 shows sample 1 which is the result of an etch process carried out with a etch gas mixture comprising $BCl_3$, $Cl_2$ and $N_2$ in equal proportion (10 sccm each). Full process parameters for the etch will be detailed with reference to Table 1 below. These tests used a 100 mm wafer; gas flows are adjusted according to the substrate area. The footing height H achieved was approximately 7.8% of the total trench depth, which is undesirably large. Tests carried out under the same process conditions using instead etch gas mixtures of $SiCl_4$, $Cl_2$ and $N_2$ in equal parts (sample 2) and $BCl_3$, $SiCl_4$ and $N_2$ in equal parts (sample 3) also produced similarly large footings as set out in Table 1 below. For all three of the sample runs carried out listed in Table 1, the other process parameters not mentioned in the table were: ICP (plasma) power of 350 W, RF bias power at 110 W/35V (1.4 W/cm² for a 100 mm diameter wafer), table temperature of 0 degrees C., 10 Torr helium behind the wafer with a flow of 2 to 3 sccm, chamber pressure 1 mT. It will be understood that the pressure behind a clamped wafer with heat transfer gas injected underneath is substantially higher than the chamber pressure.

TABLE 1

Figure 7:
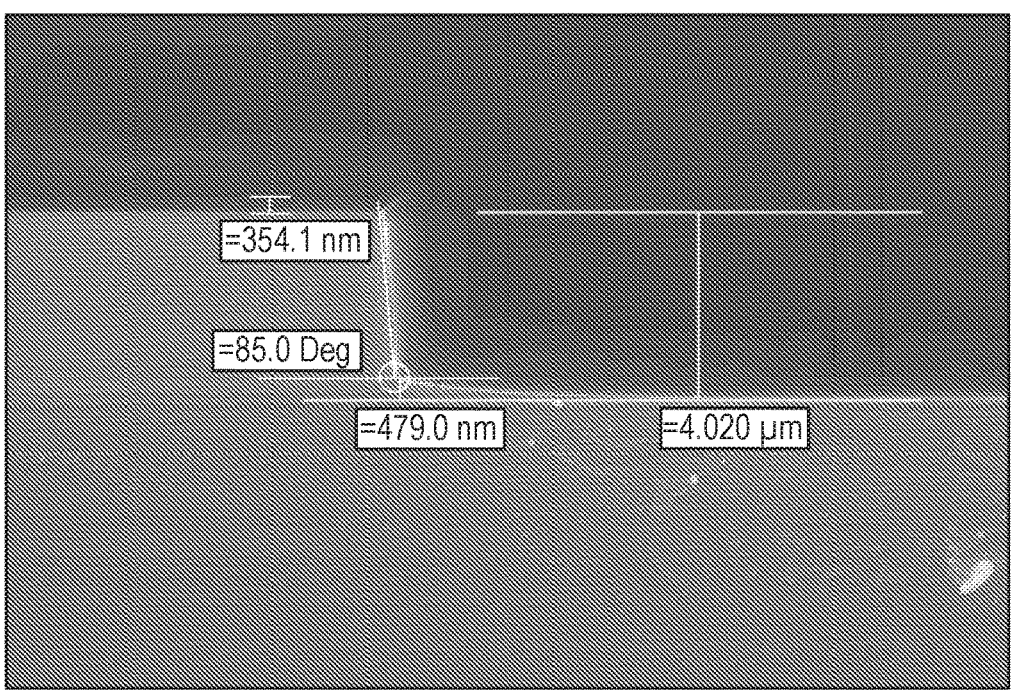

| Sample | $BCl_3$ (sccm) | $SiCl_4$ (sccm) | $Cl_2$ (sccm) | $N_2$ (sccm) | Etch rate (nm/min) | Selectivity ratio | Footing height % |
|---|---|---|---|---|---|---|---|
| 1 (FIG.6) | 10 | 0 | 10 | 10 | 612 | 2.8 | 7.8 |
| 2 | 0 | 10 | 10 | 10 | 744 | 3.2 | 7.8 |
| 3 (FIG.7) | 10 | 10 | 0 | 10 | 670 | 3.3 | 11.9 |

Further tests with increased amounts of boron trichloride ($BCl_3$) led to increased footing heights and hence were found to be disadvantageous.

Figure 8:
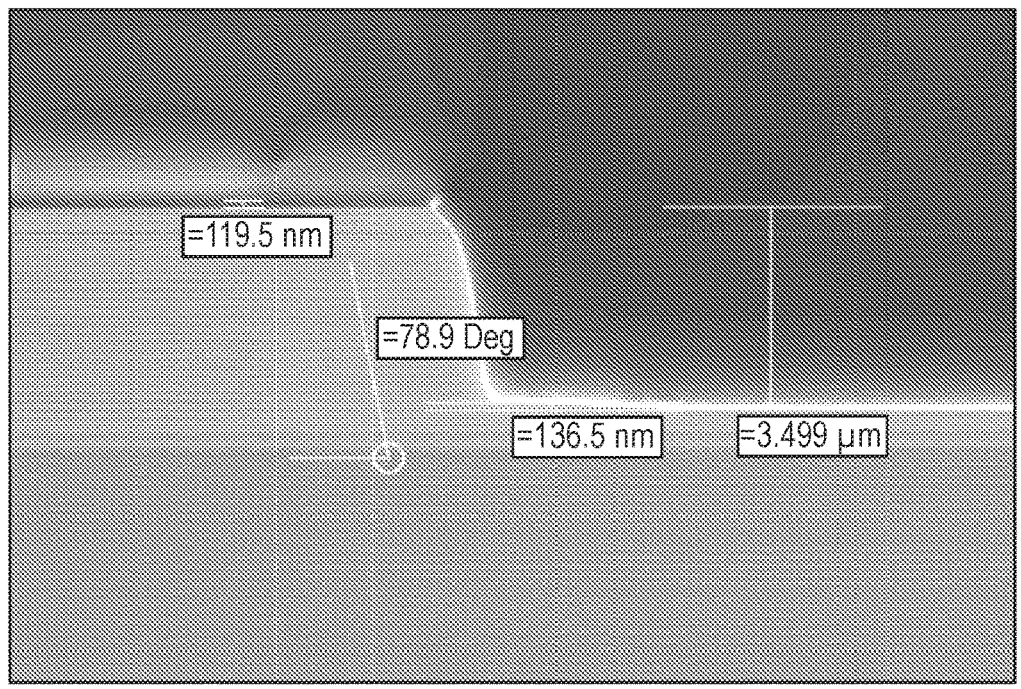
FIGS. 8, 9 and 10 are SEM images of sections cut through exemplary semiconductor structures, etched according to different embodiments of the present invention.
Figure 9:
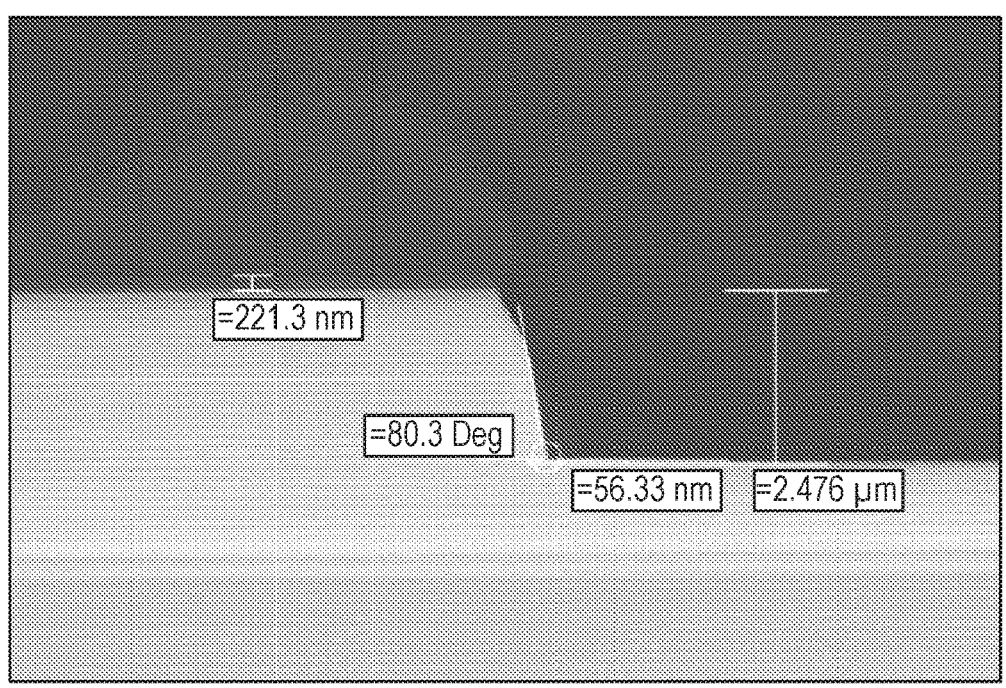
Figure 10:
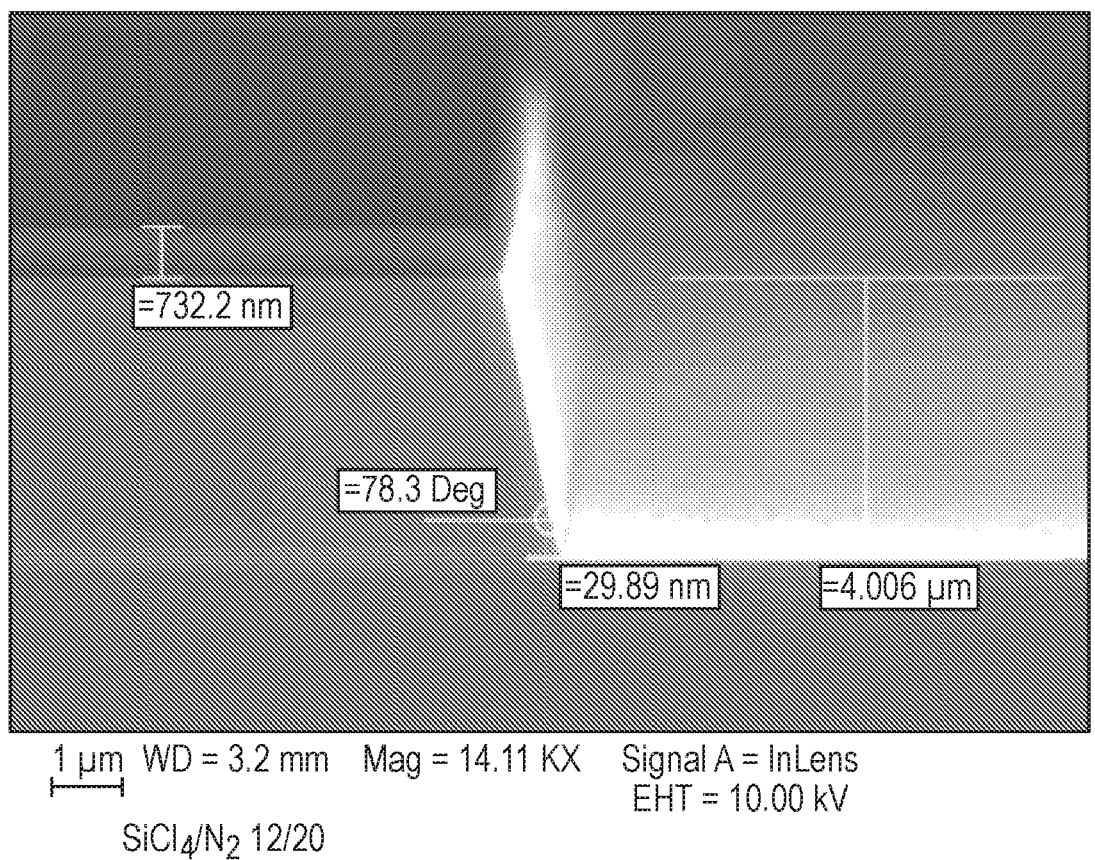

Tests were then carried out using etch gas mixtures of $SiCl_4$ and $N_2$ forming the vast majority of the total gas flow (over 90%), in accordance with embodiments of the present invention. FIGS. 8, 9 and 10 all show cross-sections through respective sample semiconductor structures etched under various different process parameters using etch gas mixtures of this sort. Full details of each sample run are given in Table 2 below. Thus in the FIG. 8 example (sample 4), the etch gas mixture comprised SiCl$_4$ and N$_2$ in the ratio 1:2 (10 sccm of SiCl$_4$ and 20 sccm of N$_2$). A footing height of 3.9% was achieved. Further tests (including those in Table 2 below) demonstrated that increasing the proportion of N$_2$ helps in reducing the footing height, but it was also found that the etch rate is slowed. However, this can be countered by increasing the plasma power as demonstrated in sample test 7, the results of which are shown in FIG. 9. Here, the proportion of SiCl$_4$ to N$_2$ is once again 1:2 but the ICP power has been increased to 750 W from 350 W, which has increased the etch rate to 412 nm per minute from 349 nm per minute.

It was further found that increasing the process pressure can also help to increase the etch rate without worsening the footing height and this is illustrated in sample test 11, the results of which are shown in FIG. 10. Here, a small increase in the proportion of SiCl$_4$ to N$_2$ was found acceptable (ratio 3:4) with an ICP plasma power of 900 W and a process pressure of 6 mT, resulting in a footing of only 0.7% and an etch rate of 800 nm per minute. Finally, for comparison, in one test sample 5, the flow of nitrogen was replaced with argon (Ar) to compare the outcome and an undesirably large footing of 11.8% resulted. The process parameters not mentioned in Table 2 were as follows for each of the listed samples: RF bias power 110 W/35V, table temperature 0 degrees C., 10 Torr, 2 to 3 sccm helium.

TABLE 2

| Sample | SiCl$_4$ (sccm) | N$_2$ (sccm) | Plasma power (W) | Process pressure (mT) | Etch rate (nm/min) | Selectivity ratio | Footing % |
|---|---|---|---|---|---|---|---|
| 4 (FIG. 8) | 10 | 20 | 350 | 1 | 349 | 2.4 | 3.9 |
| 5 | 10 | 0 (20Ar) | 350 | 1 | 466 | 2.7 | 11.8 |
| 6 | 10 | 20 | 500 | 1 | 379 | 2.2 | 2.2 |
| 7 (FIG. 9) | 10 | 20 | 750 | 1 | 412 | 1.8 | 2.2 |
| 8 | 20 | 30 | 750 | 1 | 555 | 2.1 | 2.5 |
| 9 | 20 | 20 | 1500 | 1 | 618 | 2.1 | 2.4 |
| 10 | 20 | 15 | 1500 | 1 | 754 | 2.4 | 3 |
| 11 (FIG. 10) | 12 | 20 | 900 | 6 | 800 | 4.8 | 0.7 |

It will be seen that all of the examples utilising etch gas mixture consisting predominantly of SiCl$_4$ and N$_2$ in varying proportion achieved a reduced footing height as compared with the other etch gas mixtures tested. Ratios of SiCl$_4$ to N$_2$ ranging from 1:2 to 4:3 were tested and found to give good results although, in general, mixtures having more N$_2$ than SiCl$_4$ were demonstrably better.

As noted above, SiCl$_4$ and N$_2$ should together make up over 90% of the etch gas mixture although as in the present examples other gases may be present to a minor extent, i.e. forming less than 10% of the mixture and preferably less than 5%. The helium background mentioned in the present examples falls within this category and is provided here to improve heat transfer between the wafer 30 and table 14.

In all of the samples 4, 5 and 7 to 12 discussed above, the angle α between the trench wall and the horizontal was found to be in the region of 60 to 80 degrees, typically around 75 degrees. The etch depth d in all cases was between 4 and 5 microns, on average around 4.669 microns.

Etch rates of over 500 nm per minute were achieved depending on the process parameters, and footings of less than 4% or preferably less than 3% were achieved. Masks selectivity ratios of up to 4.8 were also achieved. Overall it was noted that the etch resulted in smooth etch surfaces which were residue free.

The etching process can be brought to an end in various different ways. For example, the etch could be performed for a predetermined period of time after which duration has elapsed the process will be halted.

Figure 11A:
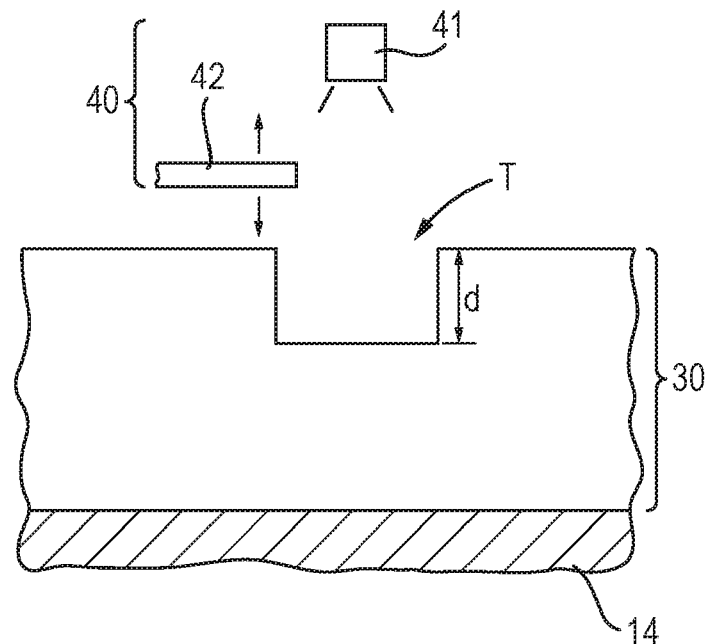
FIGS. 11(a) and 11(b) depict two examples of end point detection devices which may be used in any of the embodiments.
Figure 11B:
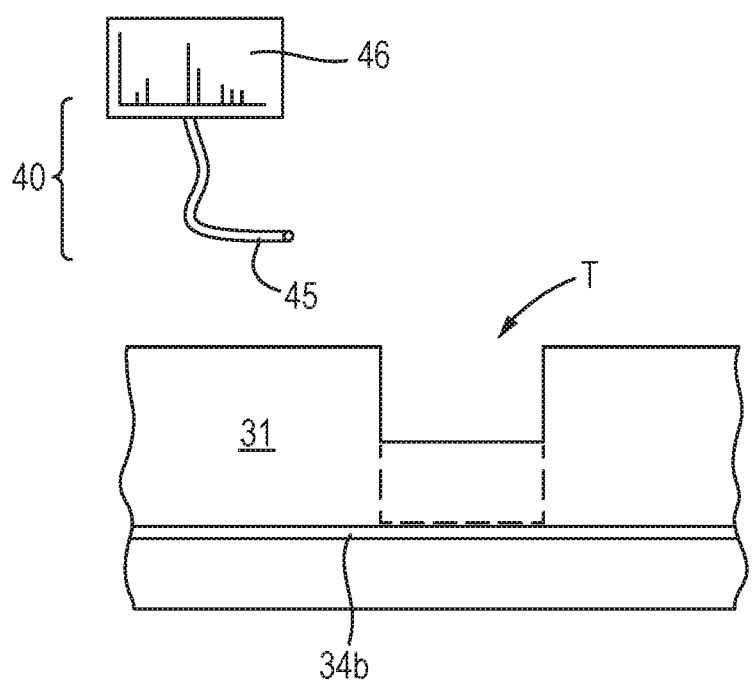

Alternatively, means may be provided for monitoring the progress of the etch such that it can be halted once a particular depth or layer within the structure 30 has been reached. FIGS. 11a and 11b illustrate two exemplary endpoint detection devices 40. In FIG. 11a, the depth of the etched trench T (or other feature) is sensed and monitored by an optical interferometer comprising an electromagnetic radiation (e.g. light) source 41 and a corresponding detector 42. One or more radiation wavelengths are directed down to the features being etched on the wafer 30 and the radiation reflected from different layers interferes resulting in changes in the amplitude of the reflected light over time as the etch proceeds. The endpoint is known to be reached when interference oscillations corresponding to the desired depth is counted.

In FIG. 11b, the composition of the material currently being etched (i.e. that of the semiconductor layer forming the base of the trench T at any one instance) is sensed by using a radiation collector such as optical fibre 45 to view radiation within the chamber emitted by the process. The collector 45 can be connected to a spectrometer 46 to select certain wavelengths which correspond to known atomic transitions which occur when the relevant materials are etched. Alternatively, optical filters could be used to select the wavelength(s) to which the sensor is responsive to achieve the same effect. When the etch depth reaches the desired layer (e.g. layer 34b) in which the trench is to stop, there will be a corresponding change in the emitted wavelengths due to the particular material now being etched. Upon detecting that the etch feature has reached the desired endpoint, the device 40 outputs a signal to the controller to halt the etch.

The etch process described may be a standalone etching procedure forming a complete process by itself, or could be a part of a longer overall process including multiple process steps or phases. For example, the overall process could be a cyclical etching and passivation process such as the Bosch process, and the described etch method could be used to implement the etching steps within that process.

The invention claimed is:
1. A method of etching into one or more epitaxial layers of respective semiconductor material(s) in a vertical cavity surface emitting laser (VCSEL) semiconductor structure, wherein the or each semiconductor material is any of: GaAs, AlGaAs, InGaAs and GaAsP, the method comprising:
  placing a substrate having the semiconductor structure thereon onto a support table in a plasma processing chamber, the semiconductor structure carrying a patterned mask on the surface of the semiconductor structure distal from the support table; and process steps of:
  establishing a flow of an etch gas mixture through the plasma processing chamber; and
  generating a plasma within the plasma processing chamber and simultaneously applying a radio frequency (RF) bias voltage to the support table;
  whereby portion(s) of the semiconductor structure not covered by the patterned mask are exposed to the etch gas mixture plasma and are thereby etched to form at least one feature in the semiconductor structure;
  wherein more than 90% of the etch gas mixture consists of a mixture of silicon tetrachloride ($SiCl_4$) and nitrogen ($N_2$), and wherein the etch gas mixture comprises more nitrogen ($N_2$) than silicon tetrachloride ($SiCl_4$) and wherein the amount of $N_2$ in the etch gas mixture is no more than three times the amount of $SiCl_4$.

2. A method according to claim 1, wherein at least 95% of the etch gas mixture consists of silicon tetrachloride ($SiCl_4$) and nitrogen ($N_2$), preferably substantially 100%.

3. A method according to claim 1, wherein the etch gas mixture further comprises one or more inert gases, such as helium, preferably forming less than 5% of the etch gas mixture.

4. A method according to claim 1, wherein the silicon tetrachloride ($SiCl_4$) is the only halogen-bearing gas in the etch gas mixture present at more than trace levels.

5. A method according to claim 1, wherein the etch gas mixture does not contain more than a trace level of boron trichloride ($BCl_3$), preferably no boron trichloride.

6. A method according to claim 1, wherein the ratio of silicon tetrachloride to nitrogen ($SiCl_4:N_2$) in the etch gas mixture is about 1:2.

7. A method according to claim 1, wherein the etch gas mixture has a total gas flow rate in the range 5 sccm to 200 sccm.

8. A method according to claim 1, further comprising controlling the pressure within the plasma processing chamber to a value in the range 0.5 to 10 mTorr.

9. A method according to claim 1, wherein the process steps are controlled such that the base of the etched feature(s) has a depth which varies across the width of the etched feature by no more than 200 nm.

10. A method according to claim 1, wherein the process steps are controlled such that the rate of etching is at least 500 nm/min.

11. A method according to claim 1, wherein the process steps are controlled such that the or each etched feature has a wall angle (a) between 60 and 80 degrees.

12. A method according to claim 1, wherein the steps are controlled such that the semiconductor to mask etch selectivity is at least 4:1.

13. A method according to claim 1, further comprising (i) halting the etching after a predetermined period of time has elapsed or (ii) monitoring the progress of the etching and halting the etching when a predetermined depth has been reached and/or when a predetermined layer in the semiconductor structure has been reached.

14. A method of processing a semiconductor structure, comprising performing the method of claim 1, as one of a sequence of processing steps, other processing steps of the sequence each comprising any of a deposition step, a passivation step, a heat-treatment step and another etching step.

15. A method according to claim 14, wherein the sequence of processing steps defines an atomic layer etching process or a reactive ion etching process.

16. A semiconductor structure etched in accordance with the method of claim 1.

17. A method according to claim 1, wherein the process steps are controlled such that the base of the etched feature(s) has a depth which varies across the width of the etched feature by no more than 4% of the average feature depth.

18. A method of etching into one or more epitaxial layers of respective semiconductor material(s) in a light-emitting diode (LED) semiconductor structure, wherein the or each semiconductor material is any of: GaAs, AlGaAs, InGaAs and GaAsP, the method comprising:
  placing a substrate having the semiconductor structure thereon onto a support table in a plasma processing chamber, the semiconductor structure carrying a patterned mask on the surface of the semiconductor structure distal from the support table; and process steps of:
  establishing a flow of an etch gas mixture through the plasma processing chamber; and
  generating a plasma within the plasma processing chamber and simultaneously applying a radio frequency (RF) bias voltage to the support table;
  whereby portion(s) of the semiconductor structure not covered by the patterned mask are exposed to the etch gas mixture plasma and are thereby etched to form at least one feature in the semiconductor structure;
  wherein more than 90% of the etch gas mixture consists of a mixture of silicon tetrachloride ($SiCl_4$) and nitrogen ($N_2$), and wherein the etch gas mixture comprises more nitrogen ($N_2$) than silicon tetrachloride ($SiCl_4$) and wherein the amount of $N_2$ in the etch gas mixture is no more than three times the amount of $SiCl_4$.

19. A method of etching into one or more epitaxial layers of respective semiconductor material(s) in a photodiode semiconductor structure, wherein the or each semiconductor material is any of: GaAs, AlGaAs, InGaAs and GaAsP, the method comprising:
  placing a substrate having the semiconductor structure thereon onto a support table in a plasma processing chamber, the semiconductor structure carrying a patterned mask on the surface of the semiconductor structure distal from the support table; and process steps of:
  establishing a flow of an etch gas mixture through the plasma processing chamber; and
  generating a plasma within the plasma processing chamber and simultaneously applying a radio frequency (RF) bias voltage to the support table;
  whereby portion(s) of the semiconductor structure not covered by the patterned mask are exposed to the etch gas mixture plasma and are thereby etched to form at least one feature in the semiconductor structure;
  wherein more than 90% of the etch gas mixture consists of a mixture of silicon tetrachloride ($SiCl_4$) and nitrogen ($N_2$), and wherein the etch gas mixture comprises more nitrogen ($N_2$) than silicon tetrachloride ($SiCl_4$) and wherein the amount of $N_2$ in the etch gas mixture is no more than three times the amount of $SiCl_4$.

* * * * *